United States Patent [19]

O'Bryan, Jr. et al.

[11] 3,938,064
[45] Feb. 10, 1976

[54] DEVICES USING LOW LOSS DIELECTRIC MATERIAL

[75] Inventors: Henry Miles O'Bryan, Jr., Plainfield, N.J.; James Kevin Pluorde, Allentown, Pa.; John Thomson, Jr., Wall Township, Monmouth County, N.J.

[73] Assignee: Bell Telephone Laboratories, Incorporated, Murray Hill, N.J.

[22] Filed: July 1, 1974

[21] Appl. No.: 484,559

Related U.S. Application Data

[63] Continuation-in-part of Ser. No. 394,187, Sept. 4, 1973, abandoned.

[52] U.S. Cl. ............. 333/73 S; 252/63.2; 252/63.5; 333/82 R; 333/83 R; 333/84 M; 333/84 R
[51] Int. Cl.²..... H01P 3/08; H01P 7/06; H01P 5/12; H01B 3/10
[58] Field of Search..... 333/73 R, 73 S, 82 R, 82 B, 333/82 BT, 83 R, 84 R, 84 M, 97 R; 252/63, 63.2, 63.5

[56] References Cited

OTHER PUBLICATIONS

Rase et al., – Phase Equilibria in the System BaO–TiO₂ in Journal of the American Ceramic Society, Vol. 38, No. 3, Mar. 1955; pp. 102–113.

*Primary Examiner*—Archie R. Borchelt
*Assistant Examiner*—Marvin Nussbaum
*Attorney, Agent, or Firm*—W. G. Nilsen

[57] ABSTRACT

Devices are described which utilize a low loss dielectric material. This dielectric material is unique in that it combines low dielectric loss with a high and temperature-stable dielectric constant. The material is made up of BaO and TiO₂ and corresponds closely in composition to the compound $Ba_2Ti_9O_{20}$. Devices utilizing this material are useful at a variety of frequencies, but are particularly advantageous in the microwave region above 0.5 GHz.

10 Claims, 6 Drawing Figures

DEVICES USING LOW LOSS DIELECTRIC MATERIAL

CROSS REFERENCE TO RELATED APPLICATION

This application is a continuation-in-part of my copending application, Ser. No. 394,187, filed Sept. 4, 1973 now abandoned.

BACKGROUND OF THE INVENTION

1. Field of the Invention

The invention relates to microwave devices employing resonant elements made from dielectric material with a specific composition of the BaO - $TiO_2$ system. Exemplary devices are pass-band filters and stop-band filters.

2. Description of the Prior Art

A variety of electrical devices use dielectric materials of various properties for various purposes. For example, materials with moderately high dielectric constants are used in such devices as dielectric resonator filters, microwave stripline circuits, various types of oscillators, as well as phase shifters, to name but a few. Dielectric constant is an important variable in the design of such devices, but equally important are low loss and temperature stability. For one class of devices, low loss is necessary to prevent dissipation of the electrical signal and for the design of circuits with high Q and narrow bandwidth. Temperature stability is required to prevent frequency changes in these devices. Good temperature stability permits much closer control of frequency characteristics when external temperature stabilization is used and may eliminate need for such stabilization in some applications. In addition, external temperature stabilization may not correct for temperature changes due to microwave heating of the dielectric material.

Up to the present time it has been relatively easy to obtain materials with high dielectric constant and low loss, but such materials have been accompanied by relatively large temperature variation of the dielectric constant. This temperature variation is measured by a temperature coefficient which represents the change in dielectric constant in parts per million per degree centigrade (ppm/degrees C). It should be recognized that device characteristics, such as frequency, etc., are particularly sensitive to slight variations in dielectric constant. This problem is usually more serious at high frequencies such as the microwave region (0.5 GHz to 200 GHz) as is the problem of low loss. For this reason, dielectric materials suitable for use in the low frequency region (below approximately 100 mc) have not been completely satisfactory in the microwave region.

The temperature coefficient of interest here is the one determined by changes of resonance frequency of a dielectric resonator. This effective temperature coefficient includes thermal expansion effects as well as dielectric effects. The effective temperature coefficient is defined by the equation:

$$\tau_{\mathit{eff}} = -2/f \, df/dT$$

in which $f$ is the resonant frequency.

Presently known dielectric materials do not have widespread use in dielectric resonator devices in the microwave region at this time. For example, one of the better materials with 20 mole percent BaO and 80 mole percent $TiO_2$ (represented by the formula $BaTi_4O_9$) has a dielectric constant of 38.0, a Q equal to 2500, but a temperature coefficient (of dielectric constant) of −49 ppm/degrees C at 2–11 GHz D. J. Masse et al, Proc. IEEE, November 1971, page 1628). Although dielectric constant and Q are satisfactory for microwave applications, the temperature coefficient is sufficiently high so that very close temperature control would be required to stabilize device characteristics. Similar results were obtained with a second material with composition 14.0 mole percent BaO and 86.0 mole percent $TiO_2$ exhibiting a dielectric constant of 50.3, a Q of 1600 and a temperature coefficient (of dielectric constant) of −368 ppm/degrees C at X band frequencies (8–12 GHz, D. W. Readey et al, "Microwave High Dielectric Constant Materials," final report on Contract No. DAAB07-69-C-0455, reports control symbol OSD01366).

SUMMARY OF THE INVENTION

The invention is concerned with microwave devices which employ materials of a specific composition as a dielectric material. The composition of the material involves largely the BaO-$TiO_2$ system. However, limited substitutions of certain oxides for BaO and $TiO_2$ can be made without adverse effects on the dielectric properties of the materials. These substituted oxides are often those which naturally occur with BaO and $TiO_2$. Thus, unintentional presence of these impurities is often advantageous economically especially for large scale production in that less pure (and therefore less expensive) materials may be used. Also, the mechanical properties of ceramics made from the material or size of the crystalline unit cell, may be improved by these substitutions.

A convenient way of defining the composition is in terms of mole percent of divalent metal oxides and mole percent of tetravalent metal oxides. The dielectric material consists essentially of a composition made up of a material that yields 18.0 – 19.0 mole percent of divalent metal oxides [XO], remainder tetravalent metal oxides [$YO_2$]. Of the total amount of XO, up to 0.4 mole percent of the XO may be a divalent metal oxide other than BaO (e.g., MgO, CaO, SrO, etc.) remainder BaO. Of the total amount of $YO_2$, up to 7 mole percent of the $YO_2$ may be a tetravalent metal oxide other than $TiO_2$ (e.g., $ZrO_2$, $HfO_2$, $SnO_2$, $SiO_2$ etc.) remainder $TiO_2$. Beyond these limits, the temperature coefficient increases significantly, Oxides other than divalent and tetravalent metal oxides should be avoided and at least be kept below 0.5 weight percent. These oxides to be avoided alter the dielectric properties of these materials, especially the low temperature coefficient. Naturally, 18.0 – 19.0 mole percent BaO, remainder $TiO_2$ is included in the above compositions and is preferred where close quality control is desirable. The material composition corresponds closely to the compound $Ba_2Ti_9O_{20}$. It is believed that the beneficial characteristics of the claimed composition range originate from the formation of this compound. Although method of preparation is not essential to the invention, a particular procedure has led to good results. This procedure will be described in the detailed description section. Microwave devices utilizing this dielectric material exhibit superior performance because of the high dielectric constant and low loss (high Q) and because the temperature coefficient is particularly low. For example, very close control of the electrical properties of microwave devices can be obtained with external temperatures stabilization and in some applications the need for external temperature stabilization may be eliminated. Typical dielectric properties for these materials are a dielectric constant of 39.8, a Q over 6,000 and an effective temperature coefficient of −5 ppm/degree C.

DETAILED DESCRIPTION

1. Electrical Characteristics as a Function of Composition

The invention is best illustrated by a study of the electrical characteristics of the dielectric material as a function of composition. The electrical characteristics are measured in the microwave region since it is in this frequency region that there is considerable difficulty in obtaining suitable properties.

The three properties which are of importance for electrical device application are dielectric constant, dielectric loss (or high Q) and temperature coefficient of dielectric constant. These quantities are measured by conventional means. The dielectric constant is obtained by measuring the resultant frequency of the $TE_{011}$ mode with the dielectric material in a specific geometry. The dielectric losses are measured by determining the Q of the $TE_{01}$ dielectric resonator mode and the effective temperature coefficient of the dielectric constant is measured by determining the change in frequency of the dielectric resonator mode as a function of temperature.

Figure 1:
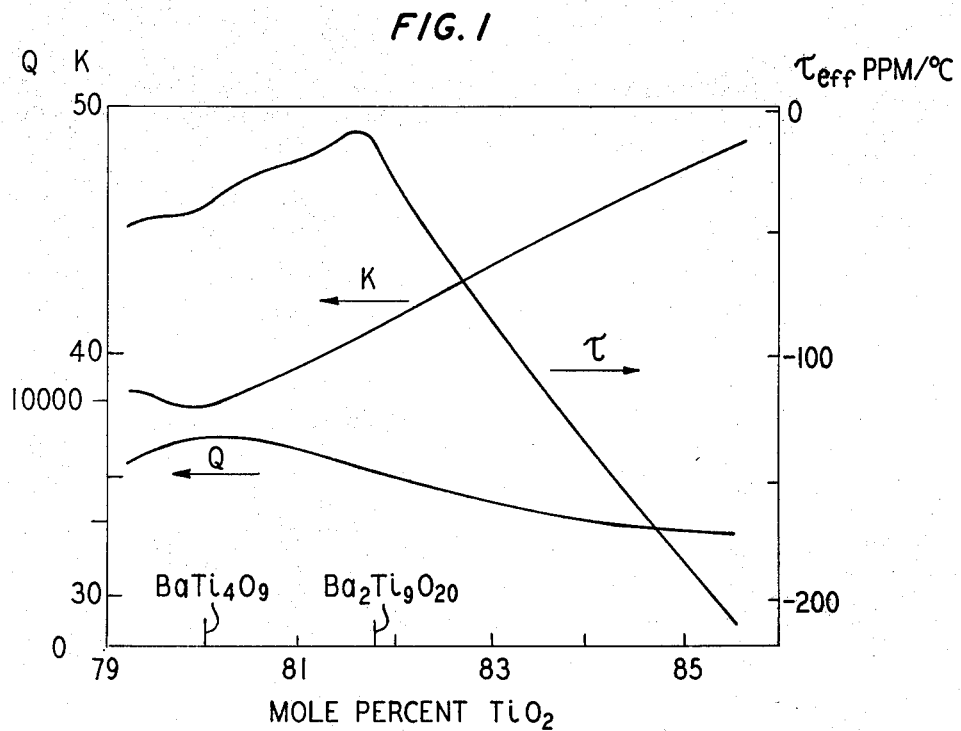
FIG. 1 is a graph showing data on dielectric constant (K), quality factor (Q) temperature coefficient ($\tau$) as a function of material composition.

The results are given in FIG. 1 where the dielectric constant, dielectric loss (in terms of the Q) and effective temperature coefficient are plotted as a function of the composition of the dielectric material. Particularly noteworthy is the fact that the absolute value of the effective temperature coefficient is a minimum close to the composition which corresponds to $Ba_2Ti_9O_{20}$.

From a device point of view, satisfactory results may be obtained from a dielectric material made up from composition 18.0 – 19.0 mole percent divalent metal oxide (XO) remainder tetravalent metal oxide ($YO_2$) with the restrictions on composition of XO and $YO_2$ outlined in the summary section. For minimum temperature coefficient of dielectric constant, 18.1 – 18.3 mole percent divalent metal oxide remainder tetravalent metal oxide is preferred with the same restrictions on composition of the divalent metal oxides and tetravalent metal oxide as outlined above for the wider composition range. Again, 18.1 – 18.3 BaO remainder $TiO_2$ is included in this composition range and is often preferred where a high degree of quality control might be desirable. It should be noted that this composition corresponds closely to the nominal composition $Ba_2Ti_9O_{20}$ from which it is believed much of the desirable dielectric properties originate.

Other studies, such as X-ray studies, indicate that the phase responsible for the unique combination of suitable dielectric properties is a compound with the approximate nominal formula $Ba_2Ti_9O_{20}$. For example, these X-ray studies show that at the composition of from 18.1 to 18.3 mole percent BaO, remainder $TiO_2$ (corresponding closely to the composition of $Ba_2Ti_9O_{20}$), only one phase is detected and outside this range, other phases begin to appear. Further, substitutions consistent with the limitations outlined above do not produce any detectable additional phases.

2. Preparation of the Dielectric Material

A large variety of methods can be used for the preparation of the dielectric material. For example, single crystals might be prepared and used in an electrical device. However, this method is sometimes economically disadvantageous because of the difficulty in preparing single crystals in large quantities and the need for specific shapes and sizes in electrical devices. For this reason a polycrystalline technique is advantageous for preparing a ceramic form of the dielectric material.

Method of preparation is illustrated where the divalent metal oxide is BaO and the tetravalent metal oxide is $TiO_2$. Starting materials can be any reagents that yield BaO and $TiO_2$ under conditions of the preparation. Reagent grade $BaCO_3$ and $TiO_2$ are convenient. Measured amounts of starting materials are mixed by conventional means, such as ball milling, freeze drying, spray drying etc. The mixed reagents are dried, screened and reacted at a temperature between 1000°C and 1200°C for 1 – 48 hours in an atmosphere containing oxygen. A reaction temperature of 1125 to 1175 for a time of 2 – 6 hours is preferred since it gives a superior product. Also, an oxygen enriched atmosphere, such as an atmosphere containing at least 90 percent oxygen is preferred for the same reason. X-ray analysis can be used to monitor the decomposition of reagents which yield BaO and $TiO_2$ on decomposition and the formation of the reaction product. Additional mixing of the reacted powder is also beneficial.

One way of carrying out the mixing referred to above is the use of ball milling (see for example *Physical Ceramics for Engineers*, by L. H. VanVlack, Addison-Wesley, 1964) in a jar made for example of polyethylene under an organic liquid such as acetone or under water. The balls are made from a variety of materials such as aluminum silicate and alumina. Organic liquids are preferred where cost is not important such as where only limited amounts of dielectric material are being made. Organic liquids do not change the stoichiometry of the reactants since the reactants are not soluble in organic liquids. Water may be preferred where cost is important. In this case, some reactant dissolves in the water and some adjustment in initial amounts of reactant is required so that the composition after ball milling corresponds to the stoichiometric composition. To avoid this problem, the water may be saturated with the reactants (or just reused continuously) prior to use in the ball mill.

Before converting into a dielectric body by sintering or hot pressing, it is preferred to acid leach the reacted starting materials. This procedure improves the Q of the final product and makes the Q more reproducible from batch to batch. It also improves the aging qualities (especially stability of the Q to thermal cycling) of the final product. Any acid with dissociation constant greater than $10^{-5}$ may be used for leaching but best results are obtained with a strong acid (dissociation constant greater than $10^{-2}$ e.g., $HNO_3$, $HCl$, $H_2SO_4$, etc.) with $HNO_3$ and $HCl$ being most preferred. For convenience, the acid leach is carried out for between 10 minutes and 6 hours. Times of 2-4 hours are preferred. The temperature may vary from the freezing point of the acid to about 50°C but room temperature is preferred for convenience. Acid leaching above 50°C is inconvenient and has no advantages over acid leaching below 50°C. Acid concentration may vary from 0.1M to ordinary concentrated acid (generally 10–18 Molar). Ordinary concentrated acid (10–18 Molar) is preferred for convenience. A typical procedure is to use concentrated $HNO_3$ (14–17 Molar) at an acid to powder ratio of 200 ml/100 gms and to carry out the acid leach for three hours at room temperature. Because this leaching procedure removes material richer in Ba than the starting material, the final product is not the desired composition which corresponds to minimum absolute value of $\tau_{eff}$. Where acid leach is used, the initial composition should be such as to compensate for this Ba loss. Typically, under the conditions described above, an initial composition of 18.4 to 18.6 mole percent BaO, remainder $TiO_2$, yields minimum value of the absolute values of $\tau_{eff}$.

Figure 6:
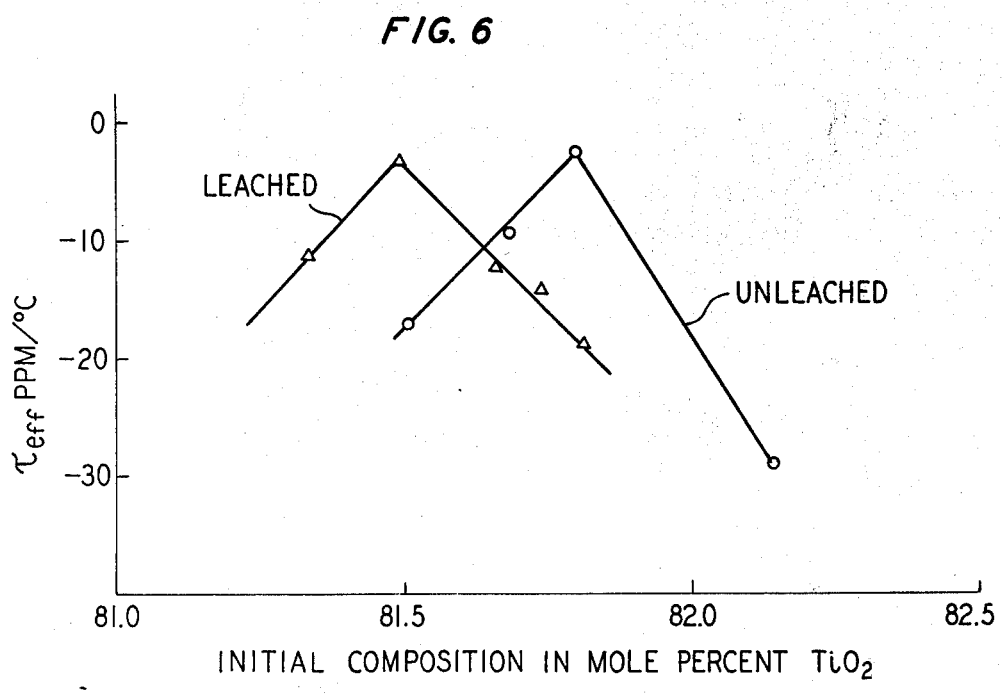
FIG. 6 is a graph showing data on temperature coefficient ($\tau$) as a function of initial material composition for acid leached and unleached procedures.

FIG. 6 illustrates the procedure by which $\tau_{eff}$ is minimized by variation in initial composition. FIG. 6 shows a graph of $\tau_{eff}$ in units of ppm/degree C VS initial composition of the dielectric material in mole percent of $TiO_2$. By varying initial concentration and measuring $\tau_{eff}$, the initial concentration for minimum $\tau_{eff}$ may be obtained for a particular acid leaching procedure. For this illustration, concentrated $HNO_3$ was used as the leaching acid and the procedure described in the above paragraph was followed. Similar results are obtained with concentrated $HCl$. Equally good results may be obtained with $H_2SO_4$ but the optimum initial concentration appears to be on the $TiO_2$ rich side of the optimum concentration of the unleached procedure.

Typical improvement in the Q as compared to the unleached material are as follows: For unleached material, the Q was 4,900; for $HNO_3$ leaching 9,400; for $HCl$ leaching 9,200 and for $H_2SO_4$ leaching 9,600.

Acid leaching improves the dielectric properties of other compositions in the $BaO-TiO_2$ systems. For example, the composition 19–21 mole percent BaO remainder $TiO_2$ when prepared into a ceramic essentially as described above but without acid leaching yields a Q of 6400 at 4 GHz frequencies. With acid leaching, the Q was found to be 9400. In this composition range, the effective compound is believed to be $BaTi_4O_9$. For this reason, compositions closer to that of $BaTi_4O_9$ [20 mole percent BaO remainder $TiO_2$] are preferred as for example 19.5 – 20.5 mole percent BaO remainder $TiO_2$. Properties and preparation of these materials are given in the following publications:

1. D. J. Masse et al, *Proceedings of the IEEE* (Lett) Vol. 59, Nov. 1971, pp. 1628–1629.

2. Microwave High Dielectric Constant Materials, final report prepared by D. W. Readey et al of the Raytheon Co. under contract No. DAAB07-69-C-0455, Technical Report ECOM-0455-F, Reports Control Symbol OSD-1366, June 1971.

A dielectric body suitable mechanically for making specifically shaped bodies for use in devices is made by either of two methods; hot pressing or sintering. Preferably, these steps should be carried out in an oxygen-enriched atmosphere. These methods involve densification of the ceramic body so that the density of this body approaches the theoretical density exhibited by, for example, single crystals of the dielectric material. In the hot pressing method the ceramic is exposed to high pressures and temperatures to make a densified product. Typical pressures are 1000–6000 psi, the lower pressure limitation to insure reasonable densification and the upper limitation for convenience since higher pressures do not provide additional benefits and to prevent fracture of the pressure die. Temperature is between 1150° and 1400°C; the lower limit to insure densification; the upper limit for convenience since higher temperatures do not provide additional benefits. The minimum time is 30 minutes to insure complete reaction; the maximum 10 hours since reaction is complete in this time. The density attained is typically 99 percent of the theoretical. Where required samples are given a reoxidation treatment. This treatment is carried out at a temperature between 900° and 1400°C, in an oxygen-enriched atmosphere for 10 – 100 hours. The lower limits are provided to insure reaction; the upper limits for convenience since higher temperature or longer reaction times provide no additional benefits.

In the sintering operation the dielectric material is first pressed in a steel die at a pressure between 2000–10,000 psi. The sample is then heated to a temperature between 1300 and 1420°C where it is maintained for 1 – 24 hours and then cooled. In the above pressure, temperature and time ranges, the lower limit is imposed to insure proper densification of the body made from the dielectric material. The upper limit is imposed for convenience since no benefits are obtained by exceeding these limits. Rates of heating and cooling higher than 300°C per hour may have detrimental effects on the product but the lower limit is for convenience only. These samples may also be exposed to a post-firing reoxidation treatment as described above.

3. Devices Employing Dielectric Material

A variety of devices may be made employing this dielectric material. Particularly advantageous is the fact that strip line techniques may be used which yield devices both smaller in size and lower in cost than waveguide devices traditionally used in the microwave region. Also, performance is superior because of the greater flexibility in device design and characteristics of the dielectric material used in these devices.

Figure 2:
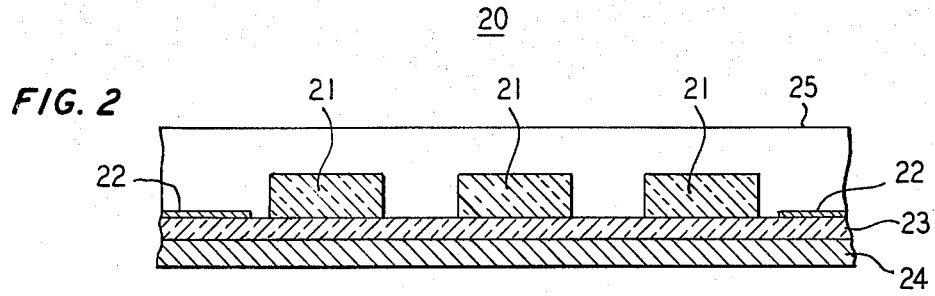
FIG. 2 shows a side view of a bandpass filter including the dielectric material.
Figure 3:
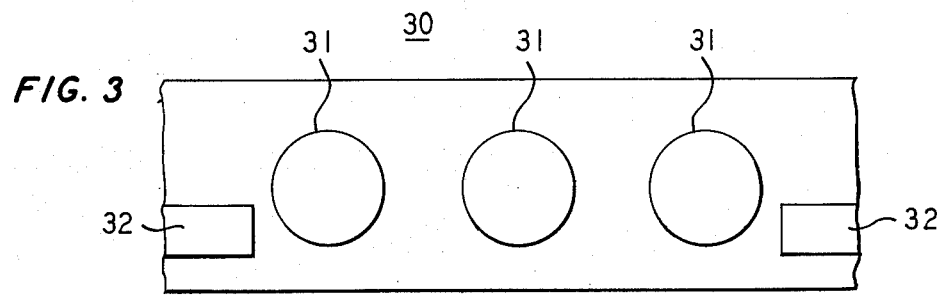
FIG. 3 is a top view of a bandpass filter including the dielectric materials.

One class of devices makes use of the dielectric material as a dielectric resonator. The dielectric resonator has dimensions and shape such that for the frequency of the microwave energy of interest, the microwave energy is resonant (has high energy storage) inside the resonator. A typical device is shown in FIGS. 2 and 3. This is a bandpass filter which allows a certain band of frequencies to propagate and reject frequencies outside this bandpass. The device shown in FIG. 2 is made up of cylindrical resonators 21 and a stripline conductor 22, ceramic substrate 23 and bottom 24 and top 25 ground planes. FIG. 3 shows a top view of this same device with cylindrical resonators 31 and stripline conductors 32. Frequency and bandpass characteristics of this device depend largely upon the diameter and height of these cylindrical resonators and spacing between these resonators. In the bandpass filter shown in FIGS. 2 and 3, the stripline is interrupted in the structure so the structure is non-propagating (in the absence of dielectric resonators) for microwave energy. One or more dielectric resonators are inserted between the interrupted stripline to couple energy from one stripline to another. Direct coupling is achieved by placing the dielectric resonators close together. Coupling can also be achieved by placing the dielectric resonator an odd multiple of one quarter wavelength apart when propagating stripline is used between the resonators. The wavelength referred to here is the microwave wavelength inside the microwave filter. Typical dimensions of the dielectric resonator for a center band frequency of 4 GHz is diameter 0.6 inches, and height 0.175 inches.

Figure 4:
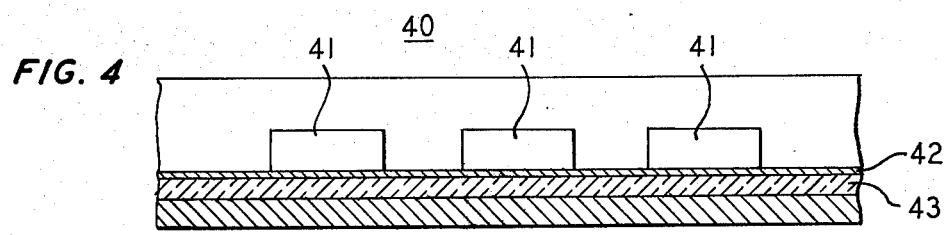
FIG. 4 is a side view of a band reject filter showing the strip line conductor and the dielectric resonator.

FIG. 4 shows a side view of a band reject filter 40 (a certain band of frequencies not propagated by the device). Here cylindrical resonators 41 are shown as well as a stripline conductor 42 and ceramic substrate 43. Here, the stripline is continuous and the structure is propagating in the absence of dielectric resonators. The dielectric resonators are placed an odd multiple of a quarter wavelength apart and make the structure non-propagating to frequencies surrounding the resonant frequency of the dielectric resonator.

Figure 5:
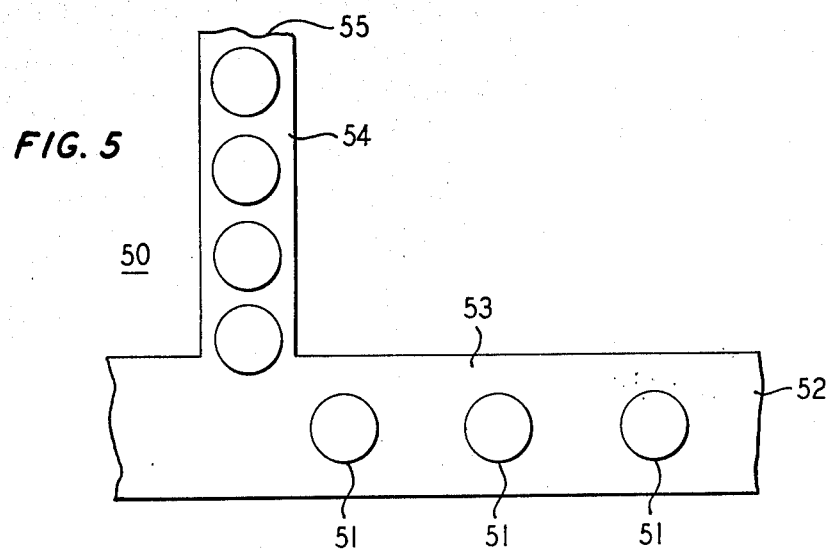
FIG. 5 is a top view of a complementary filter showing the dielectric material.

FIG. 5 shows a dielectric resonator complementary filter 50 showing dielectric resonators 51 in a propagating waveguide 52 and some dielectric resonators in a non-propagating waveguide 55. Spacing of the dielectric resonators in the propagating and non-propagating waveguide is different. The dielectric resonators are arranged in such a way so that a narrow band of frequencies usually within the frequency range propagating in the microwave circuit is rejected in the band rejection section 53 but is passed in the bandpass section 54. This has the effect of removing one narrow band of frequencies or one channel from a larger band of frequencies or multiple channels in a communication system.

What is claimed is:

1. An apparatus for processing microwave electrical energy comprising a dielectric material for interaction with the microwave electrical energy a means for introducing microwave electrical energy to the dielectric material and a conducting member to contain the microwave electrical energy in the apparatus characterized in that the dielectric material consists essentially of a composition made up of ingredients that yields 18.0 – 19.0 mole percent divalent metal oxide remainder tetravalent metal oxide in which of the total amount of divalent metal oxide 0 – 0.4 mole percent is a metal oxide other than BaO, remainder BaO and of the total amount of tetravalent metal oxide 0 – 7 mole percent is metal oxide other than $TiO_2$, remainder $TiO_2$.

2. The apparatus of claim 1 in which the ingredients consist essentially of said divalent metal oxide and said tetravalent metal oxide.

3. The apparatus of claim 1 in which the divalent metal oxide consists essentially of BaO and the tetravalent metal oxide consists essentially of $TiO_2$.

4. The apparatus of claim 1 in which said ingredients yield 18.1 – 18.3 mole percent divalent metal oxide remainder tetravalent metal oxide.

5. The apparatus of claim 4 in which the divalent metal oxide consists essentially of BaO and the tetravalent metal oxide consists essentially of $TiO_2$.

6. The apparatus of claim 1 in which the dielectric material consists essentially of a compound with approximate nominal formula $Ba_2Ti_9O_{20}$.

7. The apparatus of claim 1 which include at least one dielectric resonator in the shape of a right cylinder with dimension such that it is resonant at a particular microwave frequency.

8. The apparatus of claim 6 which includes a bandpass filter in which the means for introducing microwave electrical energy to the dielectric material is a stripline which is interrupted and at least one dielectric resonator is placed between the interrupted stripline.

9. The apparatus of claim 6 which includes a band reject filter which rejects a band of microwave frequencies in which the means for introducing microwave electrical energy to the dielectric material is a stripline which is continuous through the structure so as to form in the absence of dielectric resonators a propagating structure and in which at least one dielectric resonator is located in the structure spaced from each other at odd multiples of a quarter structure wavelength of the microwave frequency band to be rejected.

10. The apparatus of claim 6 which includes a complementary filter made up of two exit arms one of which is a bandpass filter for a particular microwave frequency and the other exit arm is a band reject filter for the same microwave frequency.

* * * * *

UNITED STATES PATENT AND TRADEMARK OFFICE
CERTIFICATE OF CORRECTION

PATENT NO. : 3,938,064

DATED : February 10, 1976

INVENTOR(S) : Henry M. O'Bryan, Jr., James K. Plourde, and John Thomson, Jr.

It is certified that error appears in the above-identified patent and that said Letters Patent are hereby corrected as shown below:

In the Heading, under Inventors, the second name is misspelled. "James Kevin Pluorde" should read --James Kevin Plourde--.

Column 2, line 1, before D. J. Masse insert --(--.

Column 3, line 41, "$TE_{01}$" should read --$TE_{01\delta}$--.

Signed and Sealed this eighteenth Day of May 1976

[SEAL]

Attest:

RUTH C. MASON
*Attesting Officer*

C. MARSHALL DANN
*Commissioner of Patents and Trademarks*